(12) United States Patent
Yap et al.

(10) Patent No.: US 8,933,547 B1
(45) Date of Patent: Jan. 13, 2015

(54) LEAD FRAME WITH POWER BAR FOR SEMICONDUCTOR DEVICE

(71) Applicants: Jia Lin Yap, Klang (MY); Yin Kheng Au, Petaling Jaya (MY); Ahmad Termizi Suhaimi, Bandar Sunway (MY); Seng Kiong Teng, Shah Alam (MY); Boon Yew Low, Petaling Jaya (MY); Navas Khan Oratti Kalandar, Petaling Jaya (MY)

(72) Inventors: Jia Lin Yap, Klang (MY); Yin Kheng Au, Petaling Jaya (MY); Ahmad Termizi Suhaimi, Bandar Sunway (MY); Seng Kiong Teng, Shah Alam (MY); Boon Yew Low, Petaling Jaya (MY); Navas Khan Oratti Kalandar, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/086,929

(22) Filed: Nov. 21, 2013

(51) Int. Cl.
*H01L 23/495* (2006.01)

(52) U.S. Cl.
CPC .... *H01L 23/49541* (2013.01); *H01L 23/49503* (2013.01)
USPC ........... 257/670; 257/671; 257/676; 257/666; 257/784; 257/E23.031

(58) Field of Classification Search
USPC ................... 257/666, 670, 676, 784, E23.031
See application file for complete search history.

(56) References Cited

U.S. PATENT DOCUMENTS

| | | | |
|---|---|---|---|
| 5,309,019 A * | 5/1994 | Moline et al. | 257/670 |
| 5,508,556 A | 4/1996 | Lin | |
| 5,543,657 A | 8/1996 | Diffenderfer | |
| 5,544,412 A | 8/1996 | Romero | |
| 5,610,437 A | 3/1997 | Frechette | |
| 6,258,629 B1 * | 7/2001 | Niones et al. | 438/111 |
| 7,211,471 B1 * | 5/2007 | Foster | 438/123 |
| 7,875,963 B1 * | 1/2011 | Kim et al. | 257/670 |
| 8,008,758 B1 | 8/2011 | Kim | |
| 8,188,579 B1 | 5/2012 | Kim | |
| 8,324,026 B2 | 12/2012 | Celaya | |
| 8,350,380 B2 | 1/2013 | Chen et al. | |
| 8,383,962 B2 | 2/2013 | Sutardja | |
| 2013/0082371 A1 | 4/2013 | Chen | |

* cited by examiner

*Primary Examiner* — Nitin Parekh
(74) *Attorney, Agent, or Firm* — Charles Bergere

(57) ABSTRACT

A lead frame for a packaged semiconductor device has multiple, configurable power bars that can be selectively electrically connected, such as with bond wires, to each other and/or to other leads of the lead frame to customize the lead frame for different package designs. One or more of the configurable power bars may extend into one or more cut-out regions in a die paddle of the lead frame, which allows for short bond wires to be used to connect the power bars to die pads of a semiconductor die mounted on the die paddle.

19 Claims, 7 Drawing Sheets

LEAD FRAME WITH POWER BAR FOR SEMICONDUCTOR DEVICE

BACKGROUND OF THE INVENTION

The present invention relates generally to packaged semiconductor devices and, more particularly, to a lead frame for a packaged semiconductor devices.

Packaged semiconductor devices typically include at least one integrated circuit (IC) die mounted on a die paddle (a.k.a. die flag) of a lead frame. The lead frame also provides leads to which the mounted die is electrically connected with bond wires. In addition to leads that provide signal paths for incoming and outgoing signals to and from the die, a lead frame also typically includes power bars that also are connected to the die using bond wires to provide power supply voltages (including possibly ground) to the die.

The number, sizes, and/or locations of the power bars can vary for different packaged device designs. As a result, lead frames are typically custom-made for specific packaged device designs, which tends to increase the cost of the lead frames. Furthermore, it is desirable to keep the bond wires used to provide power to dies in packaged devices as short as possible in order to reduce resistive power loss over the relatively thin bond wires.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Figure 1:
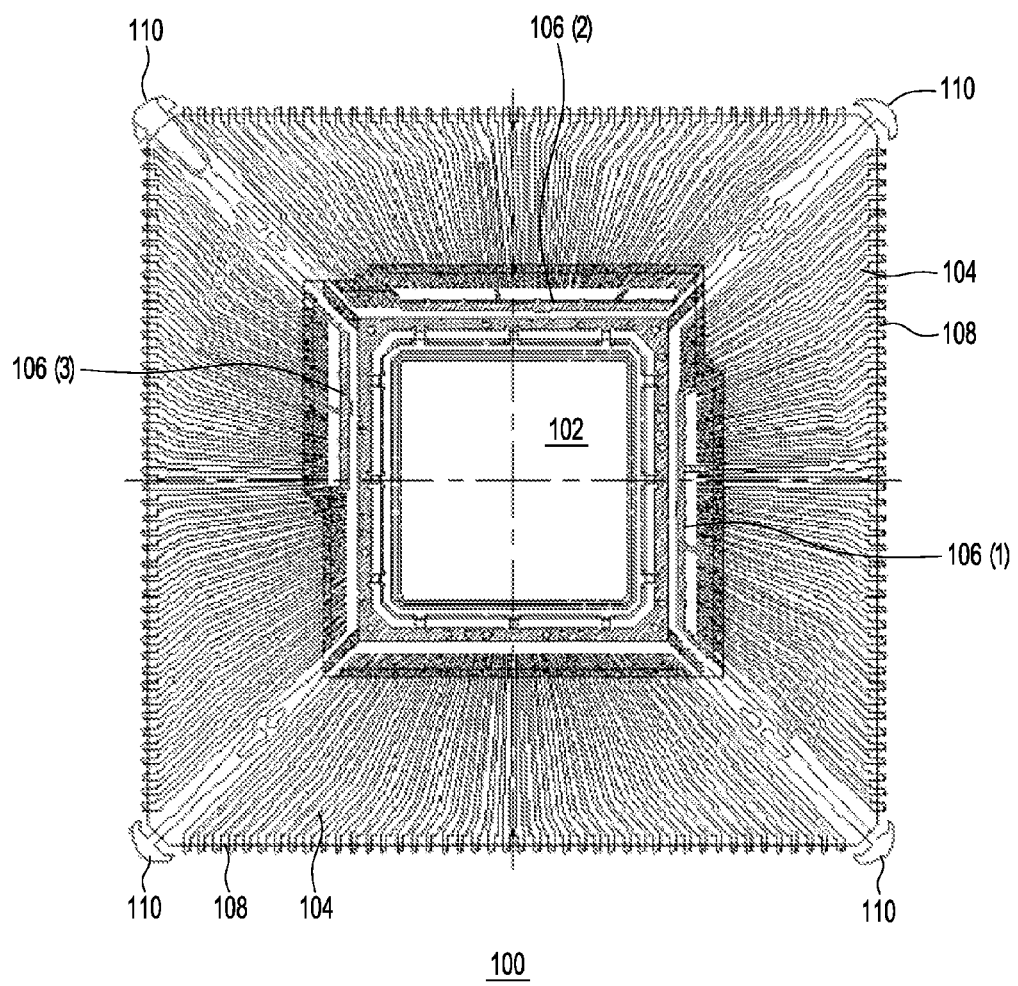
FIG. 1 shows a top plan view of a conventional lead frame for a packaged semiconductor device.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a lead frame for a packaged semiconductor device. The lead frame comprises a die paddle, a plurality of leads adjacent to the die paddle, and a plurality of power bars adjacent to the die paddle. A first power bar comprises a radial lead segment connected to a tangential bar segment proximal to the die paddle, and the tangential bar segment of the first power bar is directly connected to the die paddle.

In another embodiment, the present invention provides a lead frame for a packaged semiconductor device. The lead frame comprises a die paddle, a plurality of leads adjacent to the die paddle, and a plurality of power bars adjacent to the die paddle. First and second power bars each comprise a radial lead segment connected to a tangential bar segment proximal to the die paddle, and the tangential bar segment of the first power bar is wire-bonded to the tangential bar segment of the second power bar.

In yet another embodiment of the present invention, is a method for fabricating a lead frame for a packaged semiconductor device is provided. The method comprises (a) providing the lead frame comprising a die paddle, a plurality of leads adjacent to the die paddle, and a plurality of power bars adjacent to the die paddle, wherein (i) a first power bar comprises a radial lead segment connected to a tangential bar segment proximal to the die paddle, and (ii) the tangential bar segment of the first power bar is directly connected to the die paddle. The method further comprises (b) performing an operation on the lead frame during which the tangential bar segment of the first power bar is separated from the die paddle.

In another embodiment, the present invention is a lead frame for a packaged semiconductor device, the lead frame comprising a die paddle, a plurality of leads adjacent to the die paddle, and a plurality of power bars adjacent to the die paddle, wherein (i) a first power bar comprises a radial lead segment connected to a tangential bar segment proximal to the die paddle, (ii) the die flag has a first cut-out region along a first side of the die flag, and (iii) the tangential bar segment of the first lead extends into the first cut-out region of the die flag.

Referring now to FIG. 1, a top plan view of a conventional lead frame 100 for a packaged semiconductor device is shown. The lead frame 100 includes a central die paddle 102 and surrounding, cantilevered leads 104 and power bars 106 that are all supported by an outer support structure 108. Note that the die paddle 102 is connected to the outer support structure by four tie bars 110. During manufacture of the lead frame and/or assembly of the packaged device, the lead frame is punched, molded, and/or pressed to form a three-dimensional structure whose leads and power bars are down-set (i.e., offset in the vertical direction normal to the plane of FIG. 1) from the die paddle 102.

During the assembly of a packaged device, for example after an encapsulation step in which the lead frame is embedded within a molding compound, the outer support structure 108 is removed from the rest of the assembly, e.g., by saw or laser, thereby electrically isolating the leads 104 and power bars 106 from each other and from the die paddle 102. In other manufacturing and assembly techniques, the lead frame is pre-molded before being assembled with other components, e.g., one or more dies, to form the packaged device.

In the embodiment of FIG. 1, the lead frame 100 has three power bars 106 to support the particular packaged device design for which the lead frame 100 was custom made. Each of the power bars 106(1) and 106(2) has a length of about three-quarters of the length of one side of die paddle 102, while the power bar 106(3) has a length of only about one-half of that length. Furthermore, each of the power bars 106(1) and 106(2) is supported by four leads 104, two of which extend to the outer support structure 108, while the other two terminate before reaching the outer support structure 108. Meanwhile, the power bar 106(3) is supported by only three leads 104, only one of which extends to the outer support structure 108.

Figure 2:
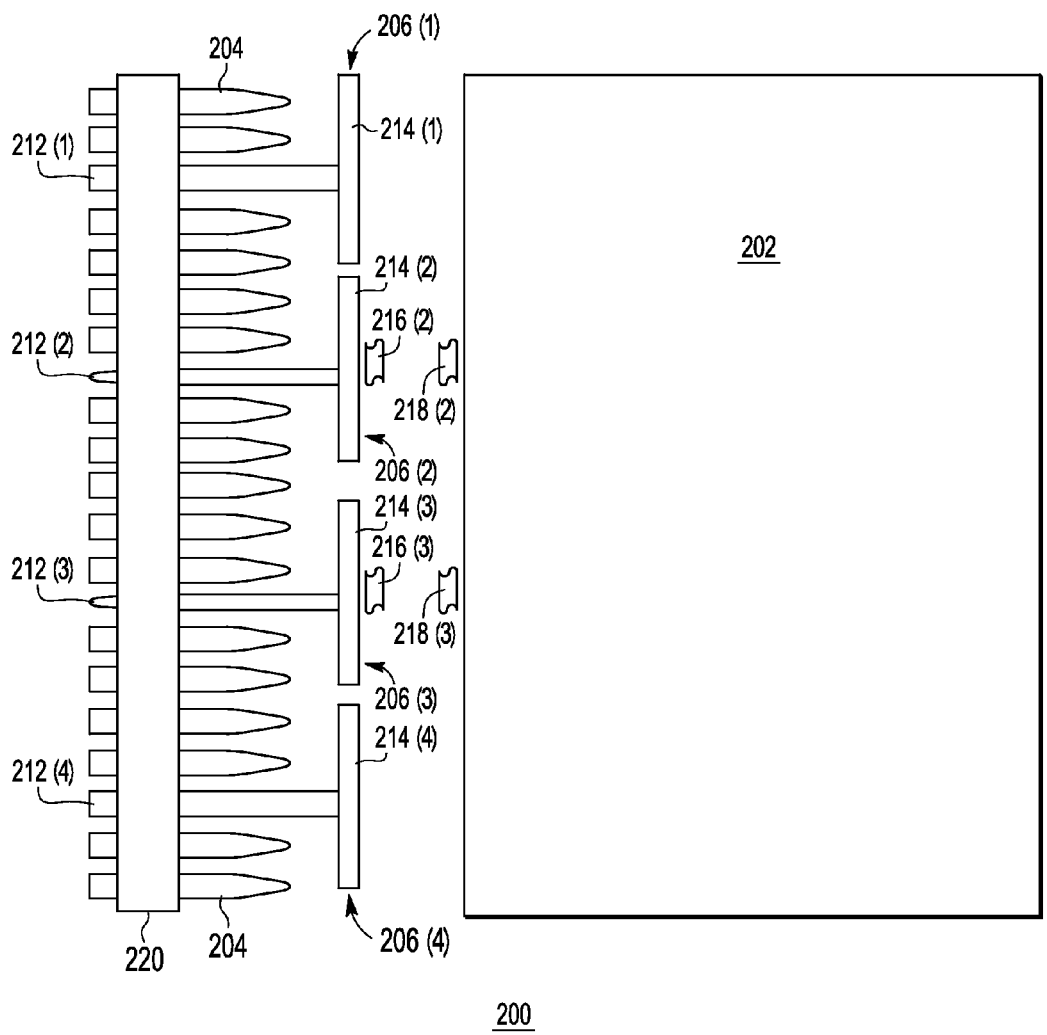
FIG. 2 shows a top plan view of a portion of an exemplary lead frame in accordance with an embodiment of the present invention.

FIG. 2 shows a top plan view of a portion of an exemplary lead frame 200 in accordance with an embodiment of the present invention. FIG. 2 shows the structure on just one side of a die paddle 202. Although not shown in FIG. 2, analogous or similar structure would typically exist on one or more of the other three sides of the die paddle 202.

In particular, FIG. 2 shows four configurable power bars 206(1)-206(4) interleaved among seventeen (17) leads 204. Each power bar 206 has a "radial" lead segment 212 and a "tangential" bar segment 214. Although not fully shown in FIG. 2, the lead segments 212(1) and 212(4) of power bars 206(1) and 206(4), respectively, extend to the outer support structure (not shown in FIG. 2), while the lead segments 212(2) and 212(3) of power bars 206(2) and 206(3), respectively, terminate before reaching that outer support structure.

In addition, as explained further below, the bar segments 214(2) and 214(3) of power bars 206(2) and 206(3), respectively, have separated support elements 216(2) and 216(3) that, along with corresponding support elements 218(2) and 218(3), previously directly connected power bars 206(2) and 206(3) to die paddle 202.

As shown in FIG. 2, the leads 204 and the radial lead segments 212 of the power bars 206 are supported by tape 220, which, depending on the particular implementation, may be applied during the manufacture of lead frame 200 or as part of the assembly process of the ultimate packaged device.

The lead frame 200 can be configured with appropriate wire bonding for use in a wide variety of different packaged device designs.

Figure 3:
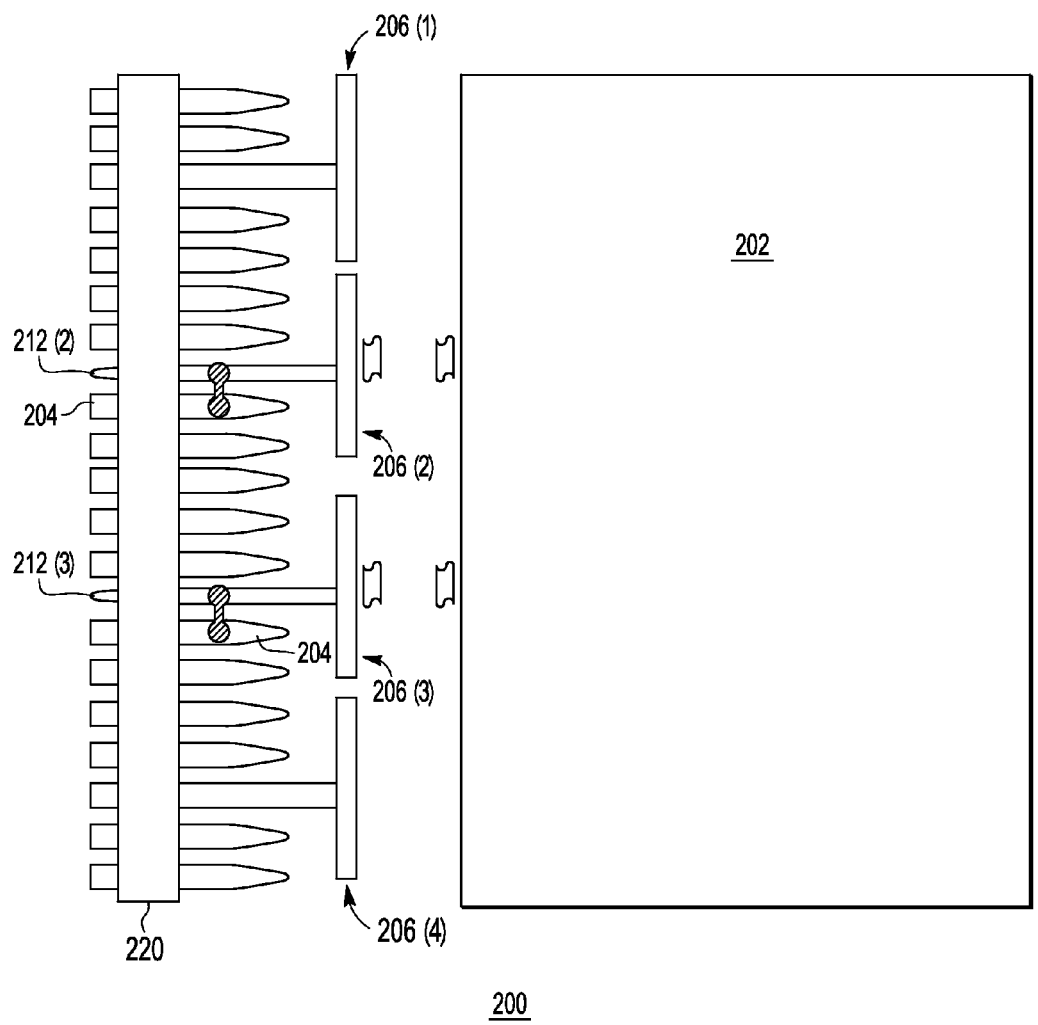
FIG. 3 shows a top plan view of one exemplary configuration of the lead frame of FIG. 2 having four distinct power bars capable of being respectively powered at four different supply voltage levels.

FIG. 3 shows a top plan view of one exemplary configuration of lead frame 200 of FIG. 2, in which power bars 206(1)-206(4) are configured as four distinct power bars capable of being respectively powered at four different supply voltage levels. This is achieved by connecting the radial lead segments 212(1) and 212(4) to respective voltage supplies external to the packaged semiconductor device, while each of the radial lead segments 212(2) and 212(3) is die bonded to an adjacent (or nearby) lead 204, which is itself connected to a corresponding external voltage supply.

Figure 4:
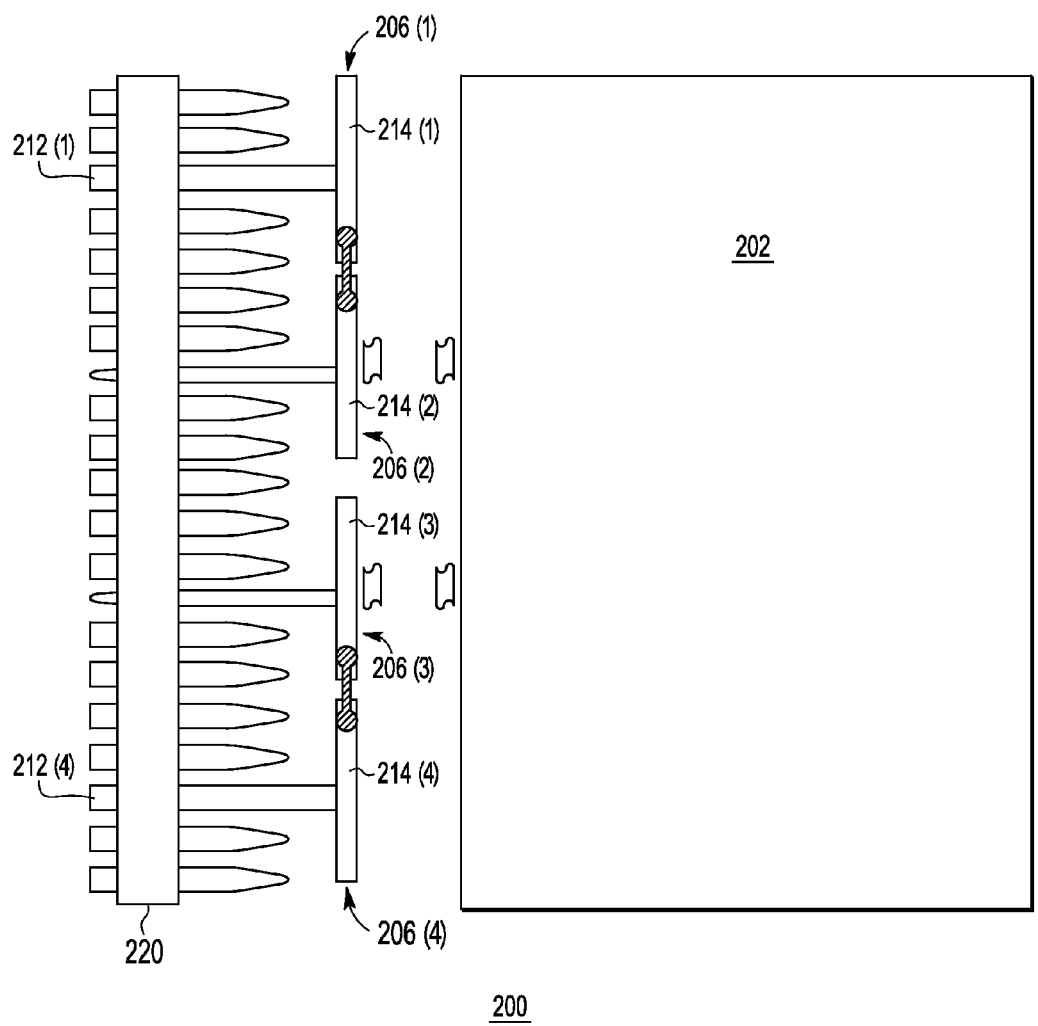
FIGS. 4 and 5 show top plan views of other exemplary configurations of the lead frame of FIG. 2, in which the four power bars are configured as two distinct power bars capable of being respectively powered at two different supply voltage levels.

FIG. 4 shows a top plan view of another exemplary configuration of lead frame 200 of FIG. 2, in which power bars 206(1)-206(4) are configured as two distinct power bars capable of being respectively powered at two different supply voltage levels. This is achieved by (i) wire-bonding tangential bar segments 214(1) and 214(2) together to form a first combined power bar, (ii) wire-bonding tangential bar segments 214(3) and 214(4) together to form a second combined power bar, and (iii) connecting radial lead segments 212(1) and 212(4) to respective external voltage supplies.

Figure 5:
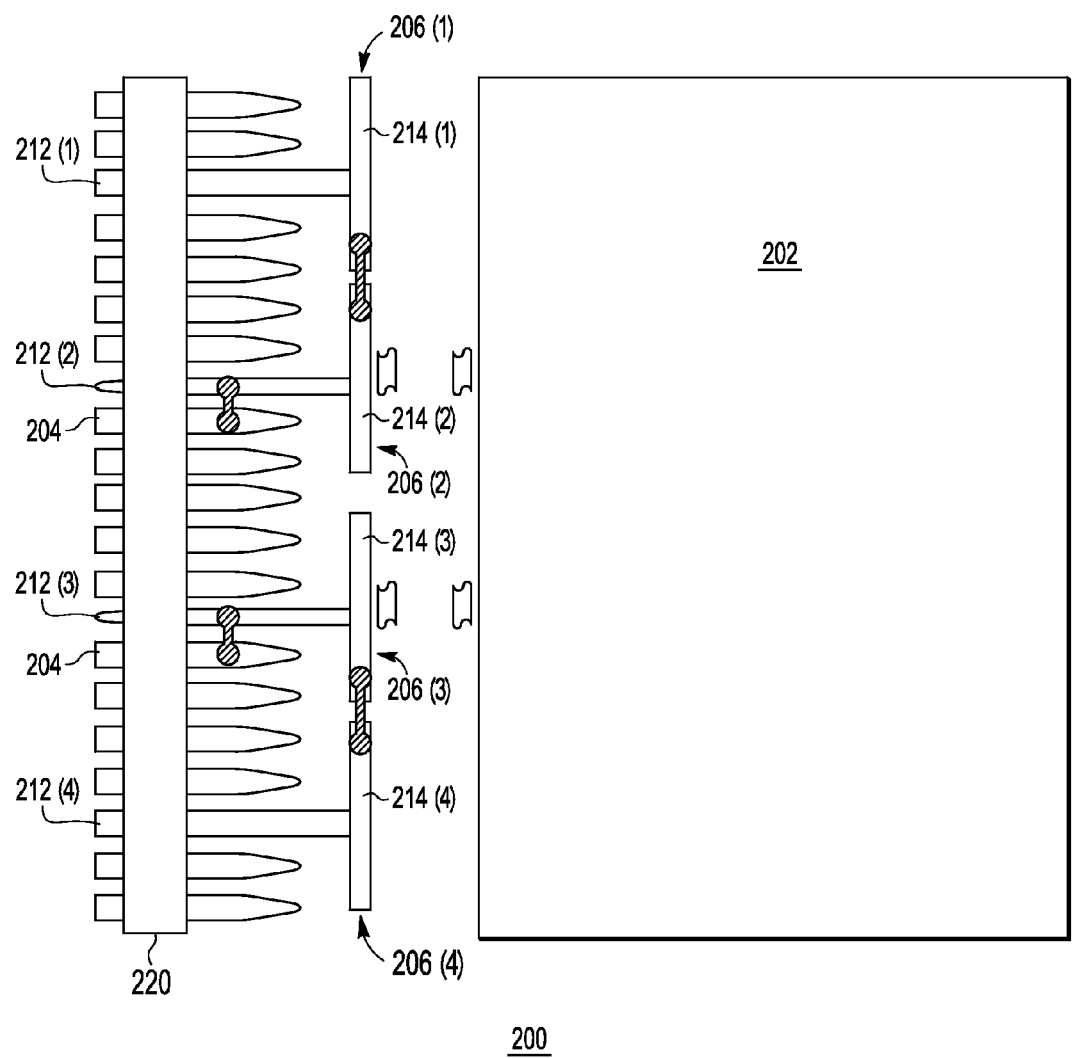

FIG. 5 shows a top plan view of another exemplary configuration of lead frame 200 of FIG. 2, in which power bars 206(1)-206(4) are configured as two distinct power bars capable of being respectively powered at two different supply voltage levels. FIG. 5 has all of the same connections as the configuration of FIG. 4. In addition, as represented in FIG. 5, radial lead segments 212(2) and 212(3) are wire-bonded to adjacent (or nearby) leads 204, which are themselves respectively connected to the same external voltage supplies as radial lead segments 212(1) and 212(4), respectively. By connecting two different leads to each external voltage supply, more power can be provided and/or resistive power losses can be reduced.

Interconnecting two or more power bars as described above produces a single combined power bar with a longer effective bar segment length. This characteristic can be advantageously exploited to limit the lengths of bond wires interconnecting the power bars to corresponding die pads on the integrated circuit(s) mounted on the die paddle in the packaged device.

Those skilled in the art will understand that there are many other possible configurations of lead frame 200 that are available to support a wide variety of different packaged device designs, including a number of configurations in which power bars 206(1)-206(4) are connected to form three distinct power bars capable of being respectively powered at three different supply voltage levels as well as those configurations in which power bars 206(1)-206(4) are connected to form a single power bar capable of being powered at a single supply voltage level.

In general and in theory, for a lead frame having N different power bars analogous to the power bars 206(1)-206(4) (possibly including analogous sets of power bars on one or more of the other three sides of the die paddle), the lead frame can be selectively configured by appropriate wire-bonding to form anywhere from 1 to N different, electrically isolated power bars in the resulting packaged device, where one or more power bars on each of two or more different sides of the lead frame could be interconnected to form a single combined power bar.

Although the lead frame has been described in the context of adjacent power bars being interconnected, in theory, two non-adjacent power bars could also be interconnected to form a single effective, combined power bar by wire-bonding from one of the two non-adjacent power bars over one or more intermediate power bars to the other of the two non-adjacent power bars.

Because the lead frame 200 (FIG. 2) can be easily configured to support so many different packaged device designs, it can be used as a universal lead frame, thereby reducing the conventional costs associated with designing and manufacturing a different, custom-made lead frame for each different packaged device design.

Figure 6:
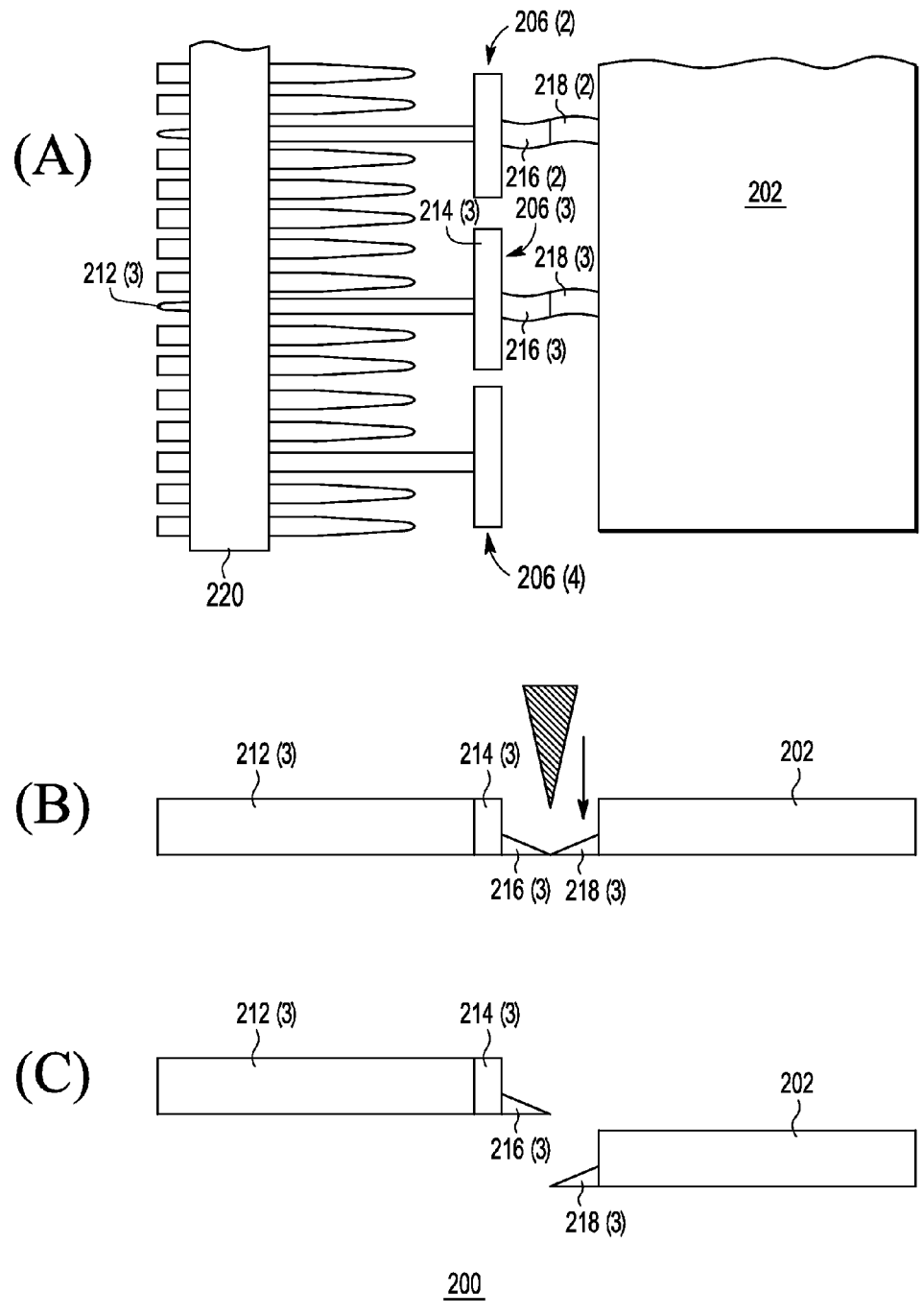
FIGS. 6(A) and 6(B) show a top plan view and a cross-sectional side view, respectively, of a portion of the lead frame of FIG. 2, before power bar support elements are separated from one another.
FIG. 6(C) shows a cross-sectional side view of the portion of the lead frame of FIGS. 6(A) and 6(B) where the power bar support elements have been separated from one another.

FIGS. 6(A) and 6(B) show a top plan view and a cross-section side view, respectively, of a portion of lead frame 200 of FIG. 2, before support elements 216 and 218 are separated from one another. In particular, FIG. 6(A) shows power bars 206(2)-206(3), where power bars 206(2) and 206(3) are directly connected to die paddle 202 by corresponding support elements 216 and 218. FIG. 6(B) shows a cross-section side view of power bar 206(3) and die paddle 202. As represented in FIG. 6(B), support elements 216(3) and 218(3) are etched or otherwise fabricated to have a relatively thin, relatively fragile interconnection that is still strong enough to support the cantilevered weight of the power bar before being separated from the die paddle. Note that, since the radial lead segment of power bar 206(4) extends to the outer support structure (not shown), power bar 206(4) does not need support elements 216 and 218.

FIG. 6(B) also represents a unified punching-and-cutting operation in which vertical offsets are formed in lead frame 200 and during which support element 216(3) is separated from support element 218(3), thereby electrically isolating power bar 206(3) from die paddle 202, the result of which is represented in FIG. 6(C). Note that tape 220 is applied before the punching-and-cutting operation. During that same operation, support element 216(2) is similarly severed from support element 218(2) to electrically isolate power bar 206(2) from die paddle 202.

Although lead frame 200 of FIG. 2 has two kinds of power bars: (i) power bars 206(1) and 206(4) which are initially connected to and supported by the outer support structure and (ii) power bars 206(2) and 206(3) which are initially connected to and supported by the die paddle, other exemplary lead frames might have only the first type or only the second type of power bars.

Figure 7:
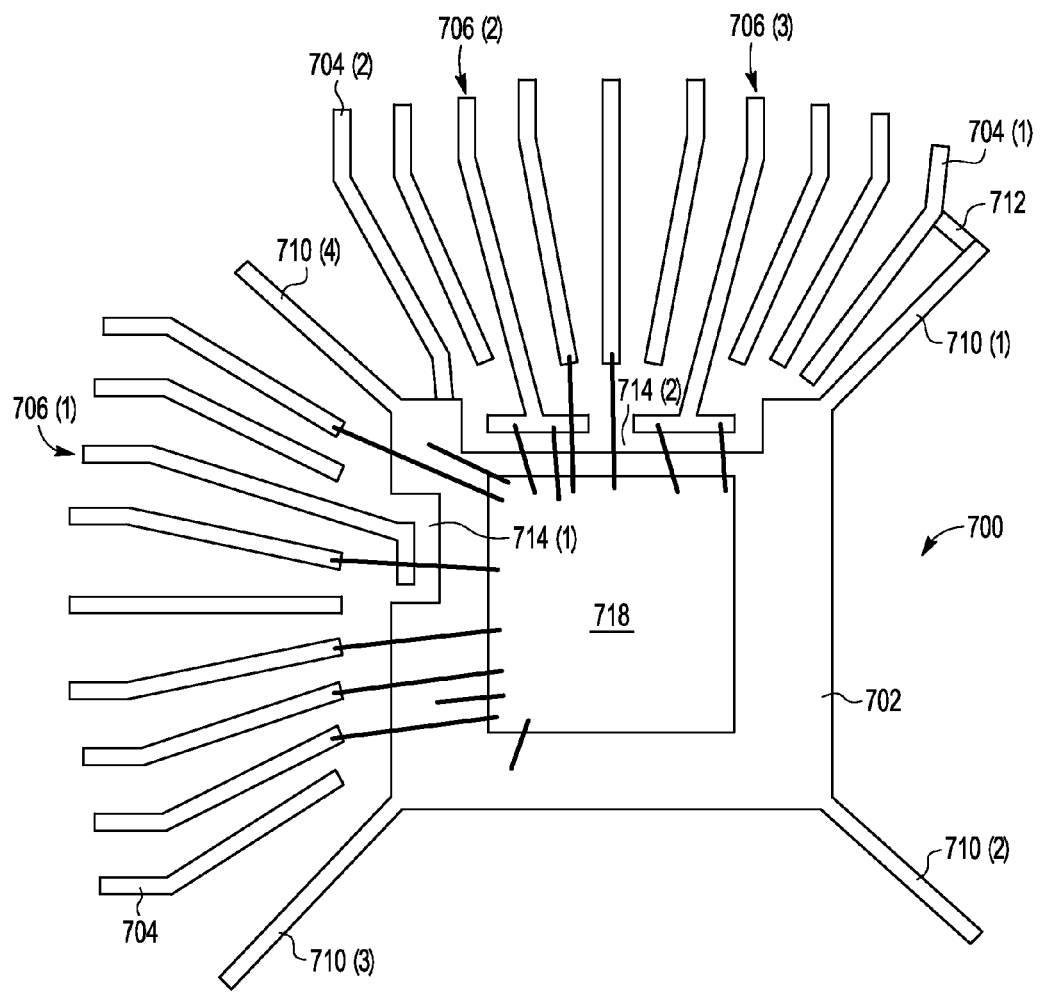
FIG. 7 shows a top plan view of an exemplary partially assembled semiconductor device having a semiconductor die mounted to the die paddle of a lead frame having power bars that extend into cut-out regions of the die paddle.

FIG. 7 shows a top plan view of an exemplary, partially assembled packaged semiconductor device having semiconductor die 718 mounted to die paddle 702 of lead frame 700. Lead frame 700 also has 16 leads 704, three power bars 706(1)-706(3), and four tie bars 710(1)-710(4). In this simplified example, lead frame 700 has leads 704 and power bars 706 on only two of the four sides of die paddle 702. In general, a lead frame may have leads and/or power bars on each of one or more sides of the die paddle.

As shown in FIG. 7, die paddle 702 has two cut-out regions 714(1) and 714(2), and the radial lead segments of power bars 706(1)-706(3) are extended such that the tangential bar segments of the power bars reside within those cut-out regions. As a result, the bond wires connecting the power bars 706 to die pads on the die 718 can be shorter than they would otherwise be if the die paddle did not have cut-out regions and if the power bars did not extend into those cut-out regions. As a result of using shorter bond wires, resistive power losses can be reduced.

As shown in FIG. 7, power bar 706(1) is an L-shaped power bar in which the radial lead segment connects near or at one end of the tangential bar segment. Power bars 706(2) and 706(3) are T-shaped power bars in which the radial lead segment connects near or at the middle of the tangential bar segment.

Although die paddle 702 has, on two sides, two cut-out regions 714 accommodating three power bars 206, in general a die paddle can have one or more cut-out regions on each of one or more sides of the die paddle, each cut-out region configured to accommodate one or more power bars.

In addition, as shown in FIG. 7, lead 704(1) is connected to tie bar 710(1) by support element 712, and lead 704(2) is extended to connect directly to die paddle 702. This illustrates two different ways of applying an external supply voltage level (e.g., ground) to die paddle 702.

Although not shown in a single diagram, the features of lead frame 200 of FIG. 2 can be combined with the features of lead frame 700 of FIG. 7 to provide a "universal" lead frame having one or more of its configurable power bars extend into one or more cut-out regions in its die paddle.

By now it should be appreciated that there has been provided an improved packaged semiconductor device and a method of forming the improved packaged semiconductor device.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non statutory subject matter are explicitly disclaimed even if they fall within the scope of the claims.

What is claimed is:

1. A lead frame for a semiconductor device, comprising:
a die paddle;
a plurality of leads adjacent to the die paddle;
a plurality of power bars adjacent to the die paddle, wherein:
   a first power bar of the plurality of power bars comprises a radial lead segment connected to a tangential bar segment proximal to the die paddle; and
   the tangential bar segment is directly connected to the die paddle; and
a tape attached to the radial lead segment of the first power bar and at least one of the plurality of leads that is adjacent to the radial lead segment of the first power bar, wherein the radial lead segment of the first power bar is supported by the tape.

2. The lead frame of claim 1, further comprising:
an outer support structure surrounding the die paddle; and
wherein a second power bar of the plurality of power bars comprises:
   a radial lead segment connected to a tangential bar segment proximal to the die paddle, and directly connected to the outer support structure.

3. The lead frame of claim 2, wherein the tangential bar segment of the second power bar is not directly connected to the die paddle.

4. The lead frame of claim 1, wherein the tangential bar segment of the first power bar is directly connected to the die paddle by a separable support structure.

5. The lead frame of claim 4, wherein the separable support structure has an intermediate portion that separates the support structure into two separated elements.

6. The lead frame of claim 4, wherein the separable support structure is configured to be severed into two separated elements during an offset operation.

7. The lead frame of claim 1, wherein the first power bar is not connected along its radial lead segment to any other part of the lead frame.

8. The lead frame of claim 1, wherein:
the die paddle has a cut-out region along a side thereof; and
the tangential bar segment of the first lead extends into the cut-out region of the die paddle.

9. A lead frame based semiconductor device, comprising:
a die paddle;
a plurality of leads adjacent to the die paddle;
a plurality of power bars adjacent to the die paddle, wherein:
first and second power bars each comprise a radial lead segment connected to a tangential bar segment proximal to the die paddle; and
   the tangential bar segment of the first power bar is electrically connected to the tangential bar segment of the second power bar with a first bond wire; and
a tape attached to the radial lead segment of the first power bar and at least one of the plurality of leads that is adjacent to the radial lead segment of the first power bar, wherein the radial lead segment of the first power bar is supported by the tape.

10. The semiconductor device of claim 9, wherein the radial lead segment of the first power bar provides an external connection to the semiconductor device.

11. The semiconductor device of claim 10, wherein the radial lead segment of the second power bar is not configured to provide an external connection to the semiconductor device.

12. The semiconductor device of claim 9, wherein the radial lead segment of the first power bar is not configured to provide an external connection to the semiconductor device.

13. The semiconductor device of claim 9, wherein the radial lead segment of the first power bar is electrically connected to a lead of the plurality of leads with a second bond wire.

14. The semiconductor device of claim 13, wherein the radial lead segment of the second power bar is electrically connected to a different lead of the plurality of leads.

15. The semiconductor device of claim 13, wherein the radial lead segment of the second power bar is not connected to any lead of the plurality of leads.

16. The semiconductor device of claim 9, wherein:
the die paddle has a cut-out region along a side thereof; and
the tangential bar segment of the first lead extends into the cut-out region of the die paddle.

17. A lead frame for a packaged semiconductor device, the lead frame comprising:
a die paddle;
a plurality of leads adjacent to the die paddle;
a plurality of power bars adjacent to the die paddle, wherein:
   a first power bar comprises a radial lead segment connected to a tangential bar segment proximal to the die paddle;
   the die paddle has a first cut-out region along a first side of the die paddle; and
   the tangential bar segment of the first lead extends into the first cut-out region of the die paddle; and
a tape attached to the radial lead segment of the first power bar and at least one of the plurality of leads that is adjacent to the radial lead segment of the first power bar, wherein the radial lead segment of the first power bar is supported by the tape.

18. The lead frame of claim 17, wherein at least one other tangential bar segment of at least one other power bar extends into the first cut-out region of the die paddle.

19. The lead frame of claim 17, wherein:
the die paddle has a second cut-out region along a second side of the die paddle; and
at least one other tangential bar segment of at least one other power bar extends into the second cut-out region of the die paddle.

* * * * *